United States Patent [19]

Hosokawa

[11] Patent Number: 5,748,646
[45] Date of Patent: May 5, 1998

[54] DESIGN-FOR-TESTABILITY METHOD FOR PATH DELAY FAULTS AND TEST PATTERN GENERATION METHOD FOR PATH DELAY FAULTS

[75] Inventor: Toshinori Hosokawa, Osaka, Japan

[73] Assignee: Matsushita Electric Industrial Co., Ltd., Osaka, Japan

[21] Appl. No.: 697,510

[22] Filed: Aug. 26, 1996

[30] Foreign Application Priority Data

Feb. 2, 1996 [JP] Japan .................... 8-017489

[51] Int. Cl.$^6$ .................................. G01R 31/28
[52] U.S. Cl. .................................. 371/22.31
[58] Field of Search ................... 371/22.1, 22.2, 371/22.3, 22.4, 22.5, 22.6

[56] References Cited

U.S. PATENT DOCUMENTS 5,625,630  4/1997  Abramovici .................. 371/22.1

OTHER PUBLICATIONS

I. Pomeranz et al., "Design–for Testability for Path Delay Faults in Large Combinational Circuits Using Test–Points", proc. of 31st ACM/IEEE Design Automation conference, 1994, pp. 358–364.

K. Cheng et al., "Generation of High Quality Non–Robust Tests for Path Delay Faults", proc. of 31st ACM/IEEE Design Automation Conference, 1994, pp. 365–369.

*Primary Examiner*—Hoa T. Nguyen
*Attorney, Agent, or Firm*—McDermott, Will & Emery

[57] ABSTRACT

There is provided a design-for-testability method for path delay faults capable of assuring high fault coverage without any substantial increase in area overhead. In a given integrated circuit, an initial pattern is generated for the path delay fault selected, and logical values set for scan flip-flops in the initial pattern are stored. A transition pattern is generated for the selected path delay fault. It is judged whether or not the integrated circuit contains a scan flip-flop of which logical value set in the initial pattern is contradictory to the logical value set in the transition pattern. In the affirmative, a value holding element, for example a D latch, having a function of once holding an input data, is inserted in the output signal line of the scan flip-flop presenting a contradiction in logical value. This D latch eliminates a contradiction in logical value in the initial and transition patterns, thereby to prevent the generation of a test pattern from meeting with failure. This results in improvements in path delay fault coverage.

13 Claims, 9 Drawing Sheets

DESIGN-FOR-TESTABILITY METHOD FOR PATH DELAY FAULTS AND TEST PATTERN GENERATION METHOD FOR PATH DELAY FAULTS

BACKGROUND OF THE INVENTION

The present invention relates to design-for-testability method and test pattern generation method for an integrated circuit, and more particularly to a design-for-testability method of facilitating a test on path delay faults in an integrated circuit and also to a test pattern generation method of generating a test pattern for an integrated circuit in which easily testable design has been made by the design-for-testability method.

With improvements in components per chip of an integrated circuit, excellent design-for-testability method and excellent test pattern generation method are required. In particular, there are increased the needs for both design-for-testability method and test pat-tern generation method of facilitating a test on path delay faults.

Typical examples of a path-delay-fault test method include the following:

(1) An initial pattern and a transition pattern are generated only by a scan flip-flop shift operation;

(2) An initial pattern is generated by a scan flip-flop shift operation, and a transition pattern is then generated by a normal operation; and (3) In addition to the method (1), there are used dedicated scan flip-flop cells in each of which the D flip-flop is connected to the output of the scan flip-flop.

Design-for-testability method and test pattern generation method for path delay faults of prior art are set forth in the paper: "Design-for-Testability for Path Delay Faults in Large Combinational Circuits Using Test-Points" (I. Pomeranz, S. M. Reddy, 1994, Design Automation Conference) and the references referred to in the bibliography thereof.

However, the path-delay-fault test methods of prior art are disadvantageous in the following points.

According to the method (1), there are many instances where the initial pattern and the transition pattern cannot be generated only by a scan flip-flop shift operation. This lowers the coverage of path delay faults.

According to the method (2), the fault coverage is generally improved as compared with the method (1). However, when setting logical values to scan flip-flops in initial and transition patterns, there may be present a scan flip-flop of which logical value in the initial pattern is contradictory to the logical value in the transition pattern, thus failing to generate the initial or transition pattern. In such a case, the fault coverage is rather lowered.

According to the method (3), a scan flip-flop cell is scanned in such that the transition pattern is held by the D flip-flop. This improves the fault coverage as compared with each of the methods (1) and (2). However, since a dedicated scan flip-flop cell is used, the area overhead of the integrated circuit is greatly increased. Further, since two flip-flops are included in one scan flip-flop cell, the number of test patterns required for scanning in the scan flip-flop cells, is doubled as compared with that in each method (1), (2).

SUMMARY OF THE INVENTION

It is an object of the present invention to provide a design-for-testability method for path delay faults capable of assuring a high fault coverage without any substantial increase in both the area overhead of an integrated circuit and the number of test patterns required for a test.

More specifically, the present invention provides a design-for-testability method for path delay faults, by which a given integrated circuit is to be changed in design for easily testing path delay faults therein, and this design-for-testability method is characterized in that, when a given integrated circuit contains a scan flip-flop for which logical values have been set in initial and transition patterns generated for a test and which presents a contradiction in logical value, a value holding element for once holding an input data according to an external instruction, is disposed at such a position as to hold an output data of the scan flip-flop in the integrated circuit.

According to the present invention, the contradiction of the scan flip-flop in logical value can be eliminated to prevent the generation of the initial and transition patterns from meeting with failure, thus assuring a high fault coverage. Further, this value holding element is actually disposed only in the signal line of a scan flip-flop presenting a contradiction in logical value. This prevents the integrated circuit from being considerably increased in area overhead.

According to the present invention, a D latch or tri-state element is preferably disposed as the value holding element, and the enable input terminal of the D latch or tri-state element is preferably connected to an external input pin of the integrated circuit. According to such an arrangement, a test pattern can readily be generated, for a circuit in which design for testability has been made, by a test pattern generation method according to the present invention with the D latch or tri-state element regarded as a selector.

According to the present invention, a scan flip-flop or D flip-flop is preferably disposed as the value holding element, and the scan flip-flop or D flip-flop thus disposed is preferably connected to a scan chain already formed in the integrated circuit. According to such an arrangement, an external terminal is not required to be newly added to the integrated circuit. Further, a test pattern can be generated, for a circuit in which design for testability has been made, by a method similar to a method of prior art.

DETAILED DESCRIPTION OF THE INVENTION

First Embodiment

A first embodiment of the present invention relates to a design-for-testability method of changing the design of an integrated circuit to facilitate a test on path delay faults therein. In this specification, a path delay fault refers to a fault that, in a signal path composed of only combinational circuits from the starting point to the terminal point, the transmission of a signal from the starting point to the terminal point takes time not less than a clock period, the starting point being an external input pin or the data output terminal of a scan flip-flop and the terminal point being an external output pin or the data input terminal of a scan flip-flop in a normal mode. When a signal supplied from the starting point is a rising signal, a path delay fault in the signal path is referred to as a rising delay fault, while when a signal supplied from the starting point is a falling signal, a path delay fault in the signal path is referred to as a falling delay fault.

Figure 1:
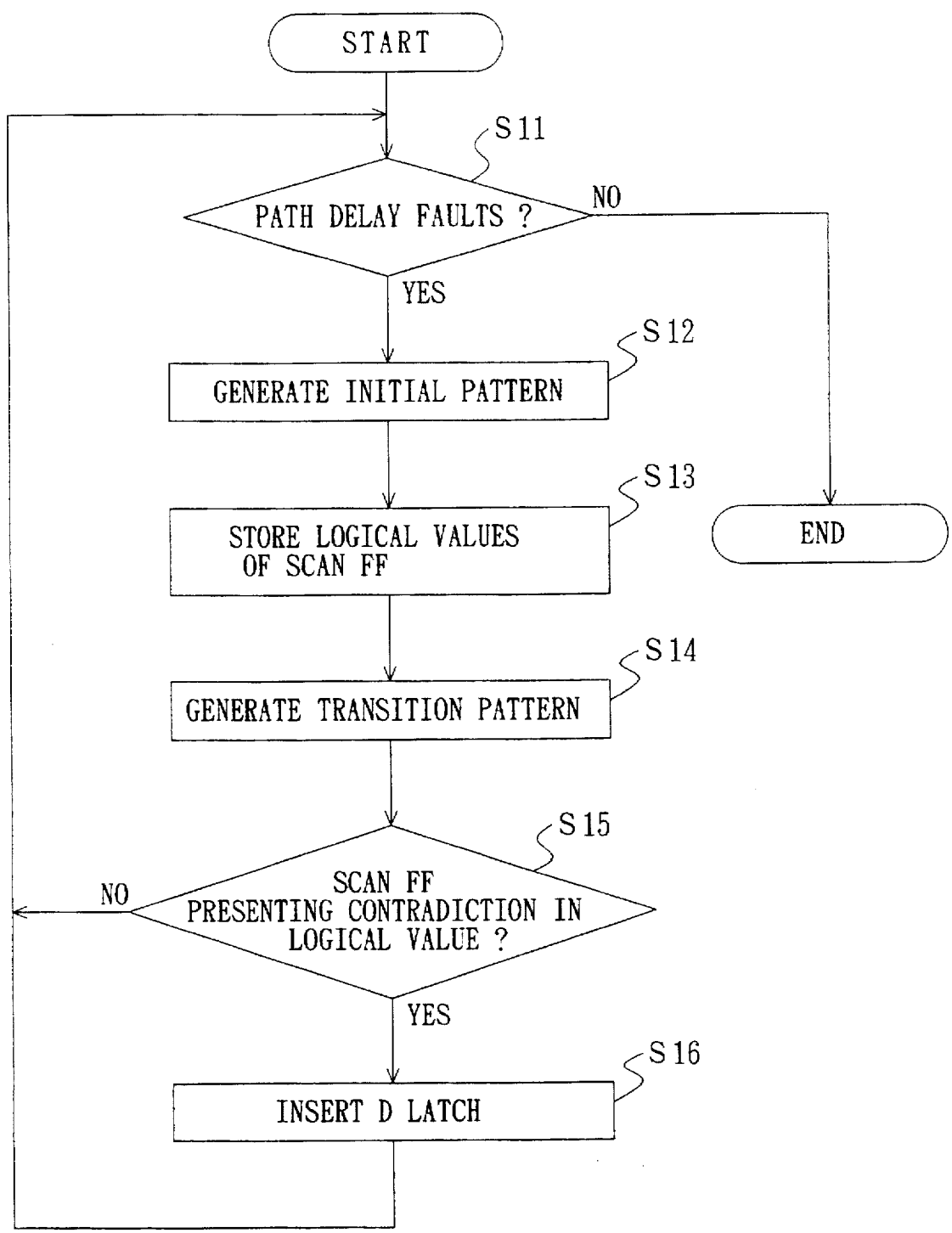
FIG. 1 is a flow chart illustrating the process of a design-for-testability method for path delay faults according to a first embodiment of the present invention.

FIG. 1 is a flow chart of the process of the design-for-testability method according to the first embodiment.

At a step S11, it is judged whether or not a given integrated circuit contains path delay faults which have not yet been processed. In the affirmative, one path delay fault to be processed is selected and the sequence proceeds to a step S12. In the negative, the process is finished.

At the step S12, an initial pattern is to be generated. More specifically, there is set, to an external input pin or the data output terminal of a scan flip-flop which serves as the signal path starting point, a logical value of "0" when the selected path delay fault is a rising delay fault, and a logical value of "1" when the selected path delay fault is a falling delay fault. Further, a logical value for sensitizing the signal path is set to an external input pin or the data output terminal of a scan flip-flop which is other than that serving as the signal path starting point.

At a step S13, there are stored the logical values of the scan flip-flops having the output terminals to which logical values have been set in the initial pattern generated at the step S12.

At a step S14, a transition pattern is to be generated. More specifically, there is set, to the starting point of the signal path, a logical value of "1" when the selected path delay fault is a rising delay fault and a logical value of "0" when the selected path delay fault is a falling delay fault. When the starting point of the signal path is the data output terminal of a scan flip-flop, the logical value of an external input pin or a scan flip-flop is set such that an input data of the first-mentioned scan flip-flop in a normal mode is identical with the set logical value. Further, the value of an external input pin or a scan flip-flop is determined such that an input data, in a normal mode, of the scan flip-flop having the data output terminal to which a logical value has been set in the initial pattern generated at the step S12 and which does not serve as the path starting point, is identical with the logical value stored at the step S13.

At a step S15, it is judged whether or not the given integrated circuit contains a scan flip-flop of which logical value stored at the step S13 is contradictory to the logical value set to its data output terminal at the step S14. When there is a scan flip-flop presenting a contradiction in logical value and the signal line traced when a logical value has been set to the output terminal of this scan flip-flop at the step S14, includes no path delay fault, the sequence proceeds to a step S16. Otherwise, the process for the selected path delay fault is regarded as finished and the sequence is returned to the step S11.

At the step S16, a D latch is inserted, in the scan flip-flop presenting a contradiction in logical value, at a position where an output data of this scan flip-flop can be held, in the signal line traced when the logical value was set to the output terminal of this scan flip-flop at the step S14. An enable input terminal of the D latch is connected to a newly added external input pin or an external input pin which is already disposed in the given integrated circuit and which is arranged to switch the scan mode to the normal mode and vice versa. When the D latch is inserted, the process for the selected path delay fault is regarded as finished, and the sequence is returned to the step S11.

Figure 2:
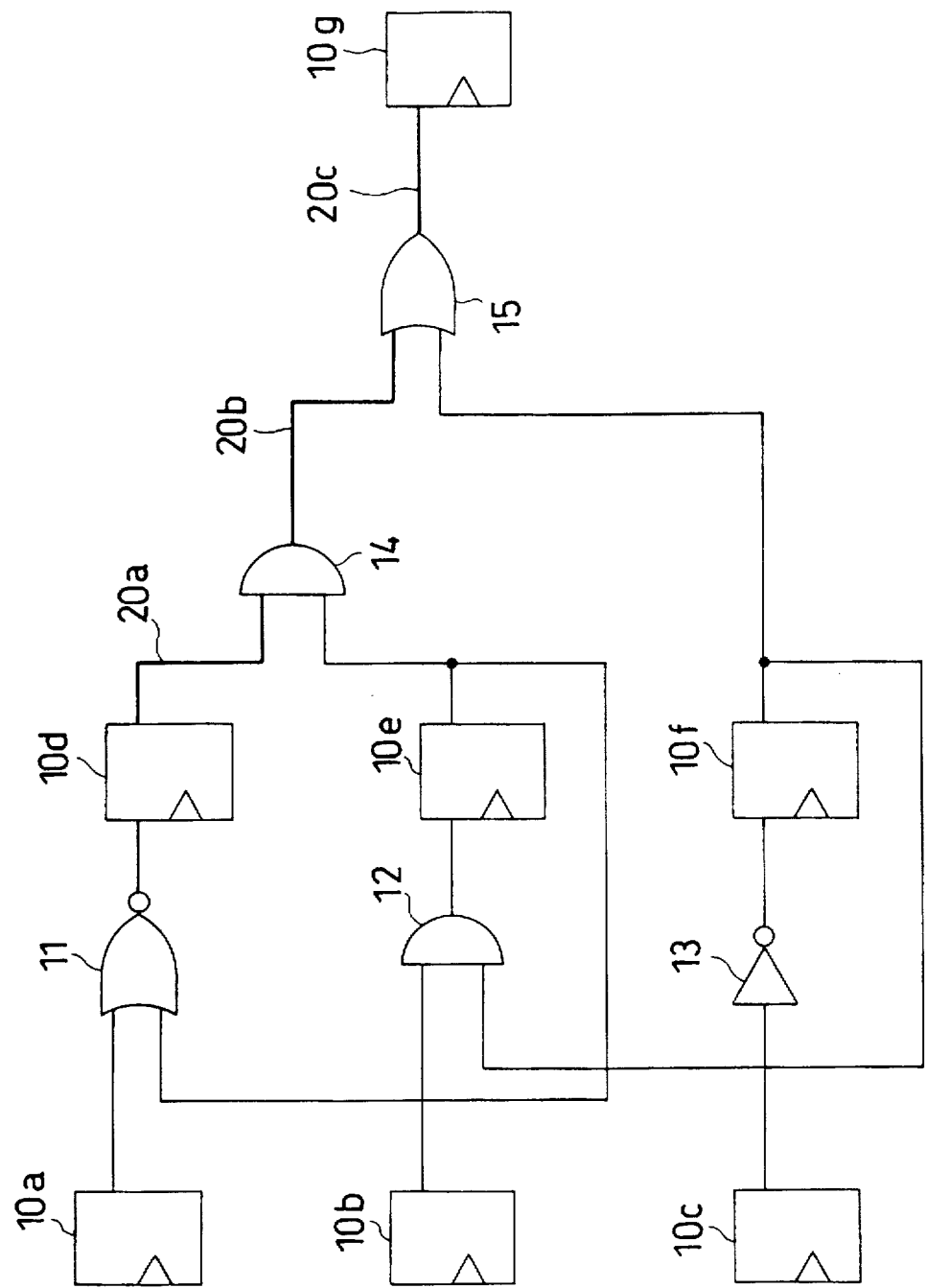
FIG. 2 is a circuit diagram of an integrated circuit to be designed for testability, which is used for illustrating the design-for-testability method according to the first embodiment.

The following description will discuss in more detail the design-for-testability method according to the first embodiment with a simple circuit taken as an example. FIG. 2 is a circuit diagram illustrating an integrated circuit to be subjected to the design-for-testability method according to the first embodiment. Shown in FIG. 2 are scan flip-flops 10a to 10g, a NOR gate 11, an AND gate 12, an inverter 13, an AND gate 14 and an OR gate 15.

In the integrated circuit in FIG. 2, a path delay fault to be processed is selected, at the step S11, out of path delay faults which have not yet been processed. It is now supposed that there is selected a path delay fault in signal paths 20a, 20b, 20c and that the selected path delay fault is a rising delay fault.

Figure 3:
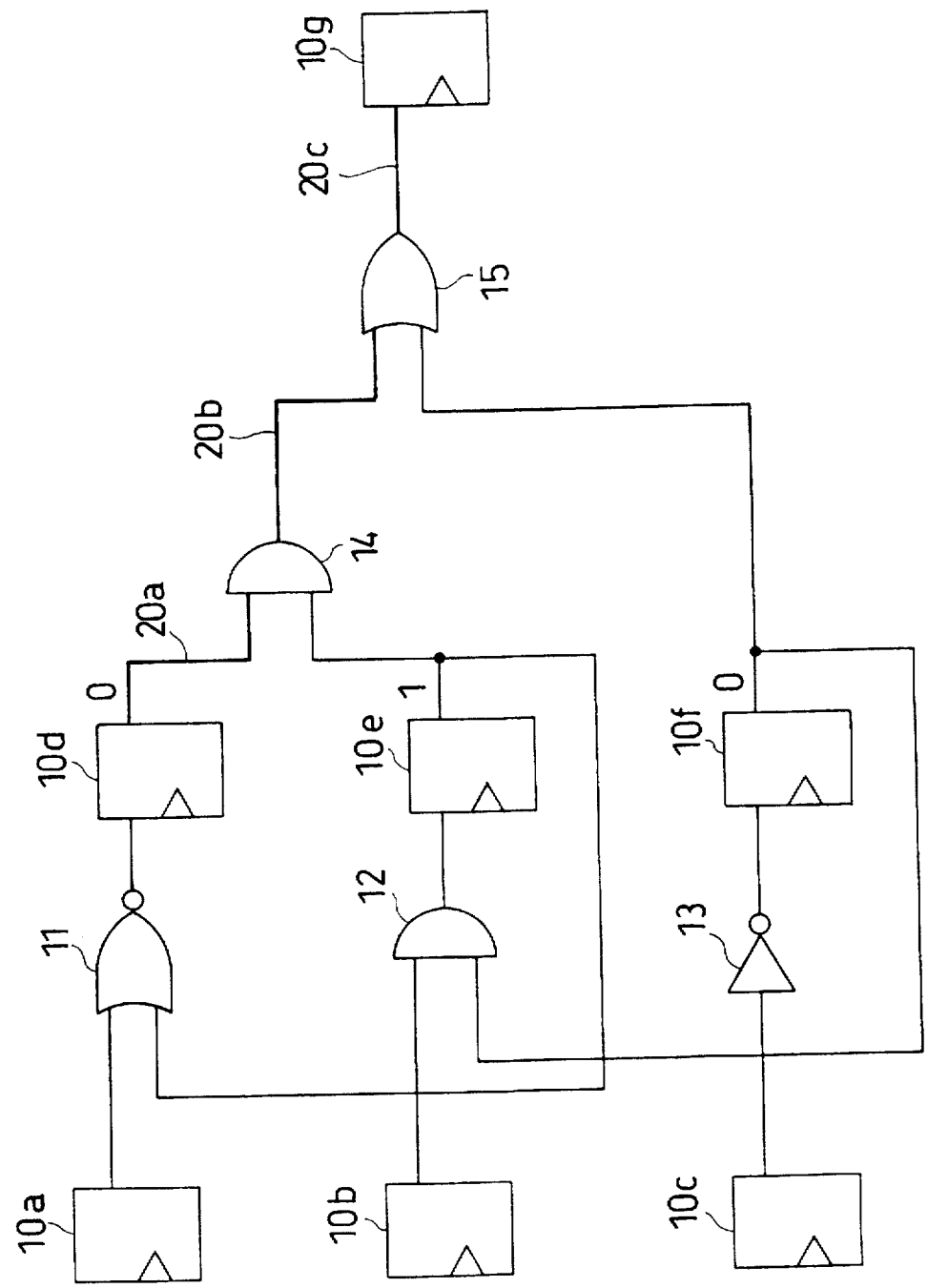
FIG. 3 is a circuit diagram illustrating the generation of an initial pattern on the circuit in FIG. 2.

At the step S12, an initial pattern is to be generated. Since the selected path delay fault is a rising delay fault, a logical value of "0" is set to the data output terminal of the scan flip-flop 10d serving as the starting point of the signal paths 20a, 20b, 20c. To sensitize the signal path 20b, a logical value of "1" is set to the scan flip-flop 10e. To sensitize the signal path 20c, a logical value of "0" is set to the scan flip-flop 10f. FIG. 3 shows the initial pattern generated at the step S12.

At the step S13, there are respectively stored, with respect to the scan flip-flops 10d, 10e, 10f, the logical value of "0" set to the data output terminal of the scan flip-flop 10d, the logical value of "1" set to the data output terminal of the scan flip-flop 10e and the logical value of "0" set to the data output terminal of the scan flip-flop 10f.

At the step S14, the transition pattern is to be generated. Since the selected path delay fault is a rising delay fault, a logical value of "1" is set to the data output terminal of the scan flip-flop 10d serving as the starting point of the signal paths 20a, 20b, 20c. A logical value of "0" is set to the data output terminal of each of the scan flip-flops 10a, 10e such that an input data of the scan flip-flop 10d in the normal mode is a logical value of "1". A logical value of "0" is set to the data output terminal of each of the scan flip-flops 10a, 10e. A logical value of "1" is set to the data output terminal of each of the scan flip-flops 10b, 10f such that the logical value of "1" set to -the data output terminal of the scan flip-flop 10e in the initial pattern generated at the step S12, is given as an input data of the scan flip-flop 10e in the normal mode. A logical value of "1" is set to the data output terminal of the scan flip-flop 10c such that the logical value of "0" set to the data output terminal of the scan flip-flop 10f in the initial pattern generated at the step S12, is given as an input data of the scan flip-flop 10f in the normal mode.

Figure 4:
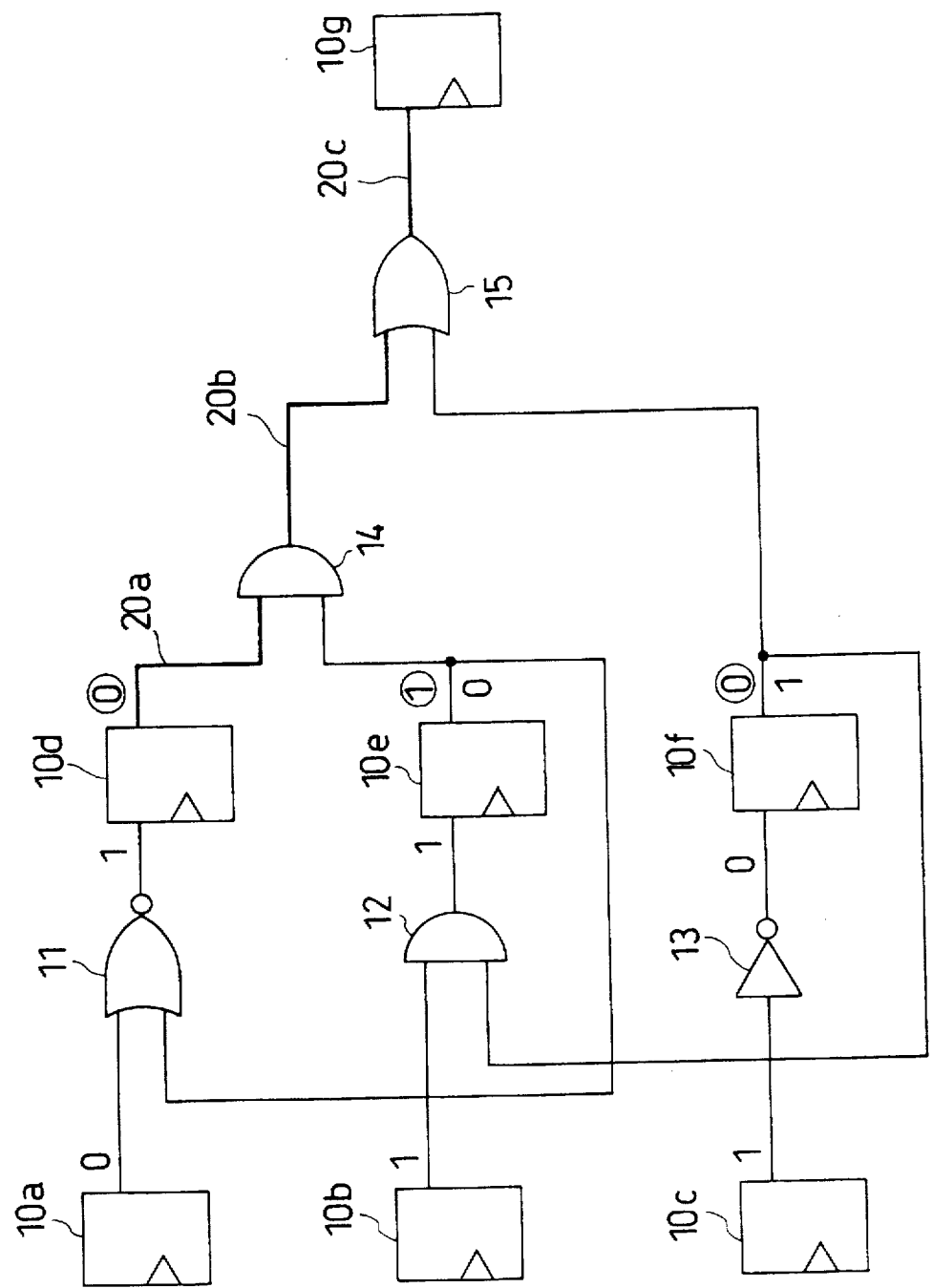
FIG. 4 is a circuit diagram illustrating the generation of a transition pattern on the circuit in FIG. 2.

FIG. 4 shows the transition pattern generated at the step S14. In FIG. 4, each numeral enclosed by ○ refers to a logical value set in the initial pattern, while each numeral not enclosed by ○ is a logical value set in the transition pattern.

At the step S15, there is searched a scan flip-flop of which logical values in the initial and transition patterns are contradictory to each other. It is understood from FIG. 4 that the logical values of each of the scan flip-flops 10e, 10f are contradictory to each other. It is now supposed that no path delay fault is present in the signal line from the data output terminal of the scan flip-flop 10e to the input terminal of the NOR gate 11 and in the signal line from the data output terminal of the scan flip-flop 10f to the input terminal of the AND gate 12.

Figure 5:
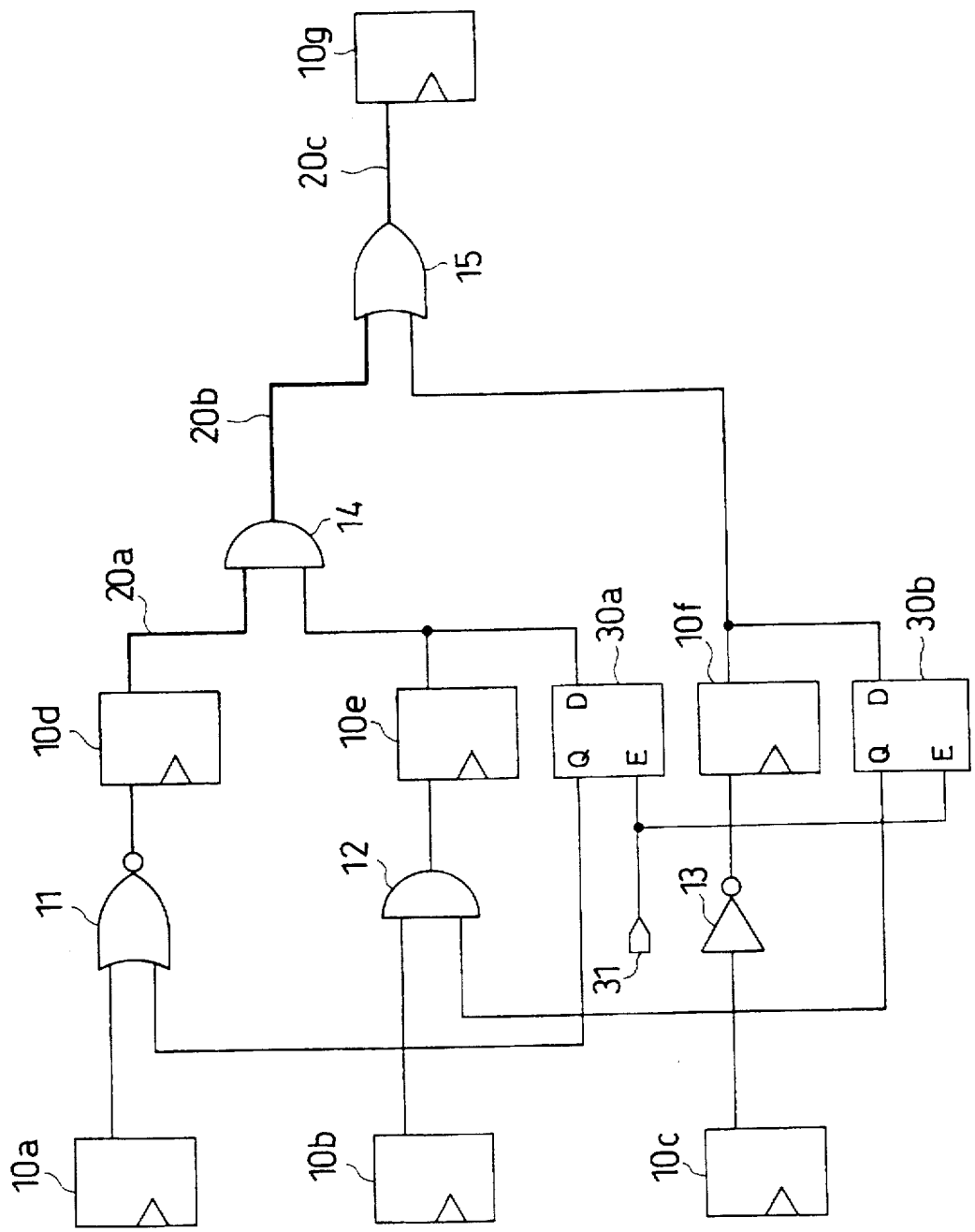
FIG. 5 is a circuit diagram illustrating the insertion of D latches into the circuit in FIG. 2.

At the step S16, a D latch is inserted in the output signal line of each scan flip-flop 10e, 10f presenting a contradiction in logical value. FIG. 5 is a circuit diagram showing the result with the D latches inserted at the step S16. In FIG. 5, a D latch 30a is inserted between the data output terminal of the scan flip-flop 10e and the input terminal of the NOR gate 11 in the signal line traced at the time when the transition pattern has been generated. Further, a D latch 30b is inserted between the data output terminal of the scan flip-flop 10f and the input terminal of the AND gate 12 in the signal line traced at the time when the transition pattern has been generated. Each of the enable input terminals of the inserted D latches 30a, 30b is connected to a newly added external input pin 31.

As discussed in the foregoing, according to the design-for-testability method of the first embodiment, a contradiction in logical value can be eliminated by inserting a D latch in the output signal line of a scan flip-flop of which logical values at the data output terminal thereof in the initial and transition patterns are contradictory to each other. It is therefore possible to generate a test pattern even for a path delay fault for which the generation of a test pattern has met with a failure in prior art. This enables an integrated circuit to be easily testable. Further, since a D latch is merely inserted in the signal line of a scan flip-flop presenting a contradiction in logical value, the integrated circuit can easily be tested with hardware reduced in amount as compared with prior art.

A tri-state element may be used instead of a D latch. In this case, the enable input terminal of the tri-state element thus disposed may be connected to an external input pin of the integrated circuit.

Second Embodiment

A second embodiment of the present invention also relates to a design-for-testability method for path delay faults. The second embodiment is different from the first embodiment in that, instead of a D latch, a flip-flop is inserted in the signal line of a scan flip-flop presenting a contradiction in logical value.

Figure 6:
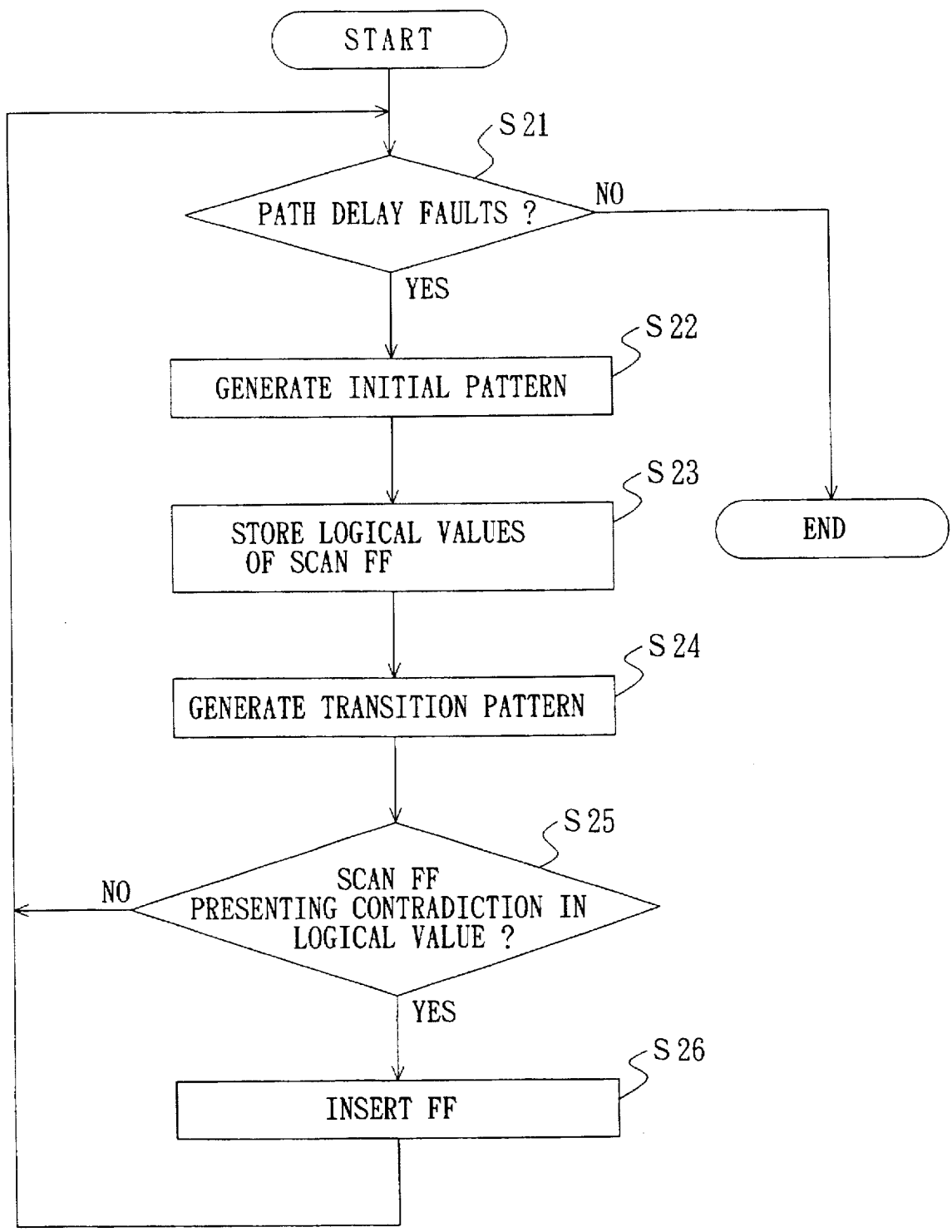
FIG. 6 is a flow chart illustrating the process of a design-for-testability method for path delay faults according to a second embodiment of the present invention.

FIG. 6 is a flow chart illustrating the process of a design-for-testability method according to the second embodiment. Steps S21 to S25 are similar to the steps S11 to S15 shown in FIG. 1.

At the step S21, it is judged whether or not a given integrated circuit contains path delay faults which have not been yet processed. In the affirmative, one path delay fault to be processed is selected and the sequence proceeds to the step S22. In the negative, the process is finished.

At the step S22, an initial pattern is to be generated. More specifically, there is set, to an external input pin or the data output terminal of a scan flip-flop serving as the signal path starting point, a logical value of "0" when the selected path delay fault is a rising delay fault, and a logical value of "1" when the selected path delay fault is a falling delay fault. Further, a logical value for sensitizing the signal path is set to an external input pin or the data output terminal of a scan flip-flop which is other than the signal path starting point.

At the step S23, there are stored the logical values of the scan flip-flops having the data output terminals to which logical values have been set in the initial pattern generated at the step S22.

At the step S24, a transition pattern is to be generated. More specifically, there is set, to the signal path starting point, a logical value of "1" when the selected path delay fault is a rising delay fault and a logical value of "0" when the selected path delay fault is a falling delay fault. When the signal path starting point is the data output terminal of a scan flip-flop, the logical value of an external input pin or a scan flip-flop is set such that an input data of the first-mentioned scan flip-flop in a normal mode, is identical with the set logical value. Moreover, the value of an external input pin or a scan flip-flop is determined such that an input data, in a normal mode, of the scan flip-flop having the data output terminal to which the logical value has been set in the initial pattern generated at the step S22 and which does not serve as the path starting point, is identical with the logical value stored at the step S23.

At the step S25, it is judged whether or not the given integrated circuit contains a scan flip-flop of which logical value stored at the step S23 is contradictory to the logical value set to its data output terminal at the step S24. When there is a scan flip-flop presenting a contradiction in logical value and the signal line traced when a logical value was set to the output terminal of this scan flip-flop at the step S24, includes no path delay fault, the sequence proceeds to the step S26. Otherwise, the process for the selected path delay fault is regarded as finished and the sequence is returned to the step S21.

At the step S26, a D flip-flop or scan flip-flop is inserted, for the scan flip-flop presenting a contradiction in logical value, at a position where an output data of this scan flip-flop can be held, in the signal line traced when the logical value was set to the output terminal of this scan flip-flop at the step S24. The D flip-flop or scan flip-flop thus inserted is connected to a scan chain already formed in the given integrated circuit. When the D flip-flop or scan flip-flop is inserted, the process for the selected path delay fault is regarded as finished and the sequence is returned to the step S21.

The following description will discuss in more detail the design-for-testability method according to the second embodiment with the circuit in FIG. 2 taken as an example. At the steps S21 to S25, an initial pattern and a transition pattern are generated for signal paths 20a, 20b, 20c. As shown in FIG. 4, there are determined scan flip-flops 10e, 10f each of which presents a contradiction in logical value. Up to this point, the operations are the same as in the first embodiment.

At the step S26, scan flip-flops are inserted in the output signal lines of the scan flip-flops 10e, 10f each of which presents a contradiction in logical value.

Figure 7:
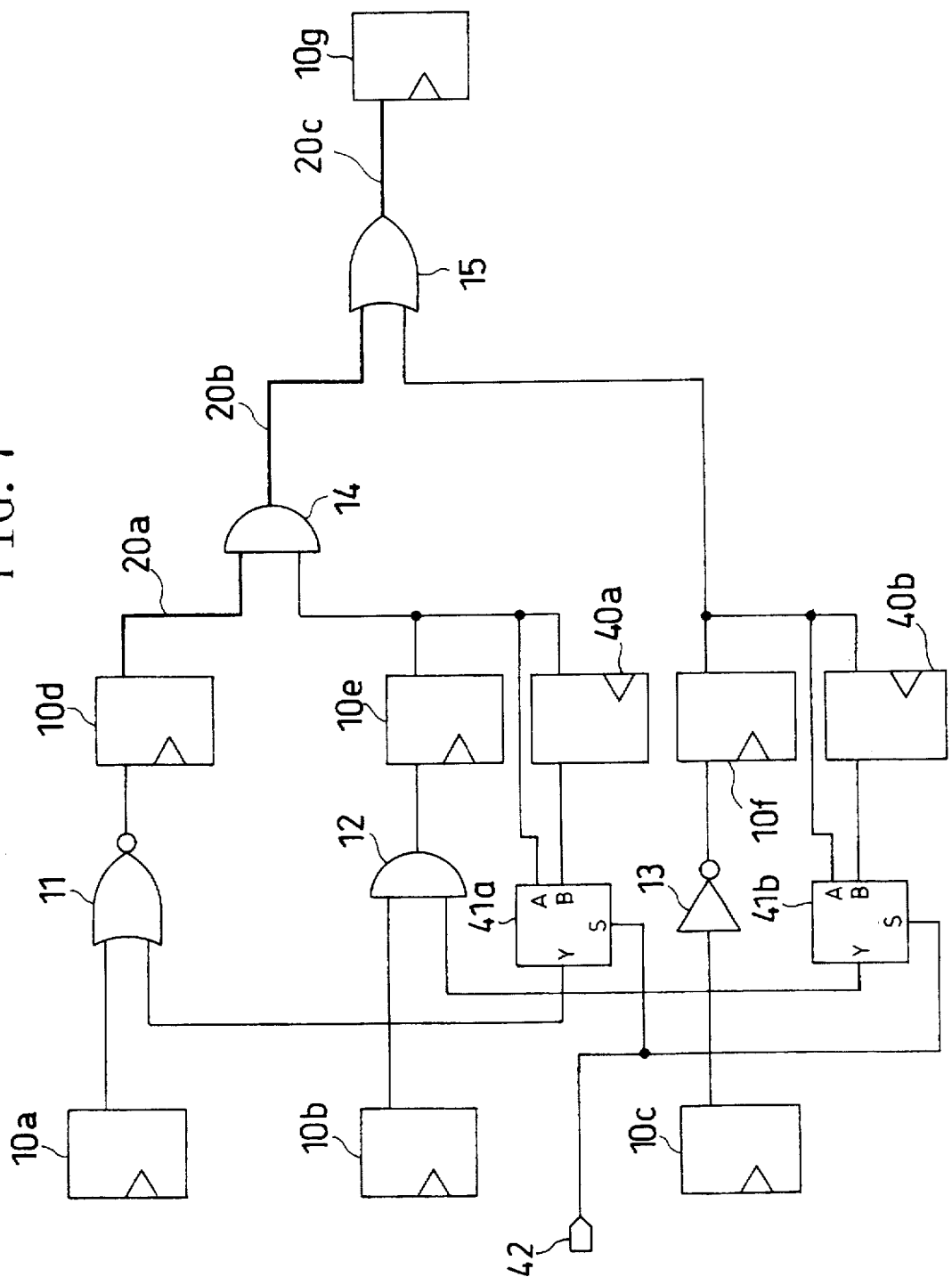
FIG. 7 is a circuit diagram illustrating the insertion of D flip-flops or scan flip-flops into the circuit in FIG. 2.

FIG. 7 is a circuit diagram illustrating the result with the scan flip-flops inserted at the step S26. In FIG. 7, a scan flip-flop 40a is inserted between the data output terminal of the scan flip-flop 10e and the input terminal of the NOR gate 11 on the signal line traced when the transition pattern has been generated. A selector 41a is inserted between the NOR gate 11 and the scan flip-flop 40a. The selector 41a is arranged to selectively supply, according to a signal supplied from a newly added external input pin 42, one of an output data of the scan flip-flop 10e and an output data of the inserted scan flip-flop 40a. Further, a scan flip-flop 40b is inserted between the data output terminal of the scan flip-flop 10f and the input terminal of the AND gate 12 on the signal line traced when the transition pattern has been generated. A selector 41b is inserted between the scan flip-flop 40b and the AND gate 12. The selector 41b is arranged to selectively supply, according to a signal supplied from the external input pin 42, one of an output data of the scan flip-flop 10f and an output data of the scan flip-flop 40b. The scan flip-flops 40a, 40b thus inserted are newly connected to a scan chain formed by another scan flip-flops 10a to 10g.

As discussed in the foregoing, according to the design-for-testability method of the second embodiment, a contradiction in logical value can be eliminated by inserting a D flip-flop or scan flip-flop in the output signal line of a scan flip-flop of which logical values at the data output terminal thereof in the initial and transition patterns are contradictory to each other. It is therefore possible to generate a test pattern even for a path delay fault for which the generation of a test pattern has met with failure in prior art. This enables an integrated circuit to be easily testable. Further, since a D flip-flop or scan flip-flop is merely inserted in the signal line of a scan flip-flop presenting a contradiction in logical value, the integrated circuit can easily be tested with hardware reduced in amount as compared with prior art.

For a circuit changed in design by the design-for-testability method according to the second embodiment, a test pattern can be generated by a test pattern generation method of prior art.

Third Embodiment

A third embodiment of the present invention provides a test pattern generation method to be used for an integrated circuit in which design for testability has been made for path delay faults by the design-for-testability method according to the first embodiment.

Figure 8:
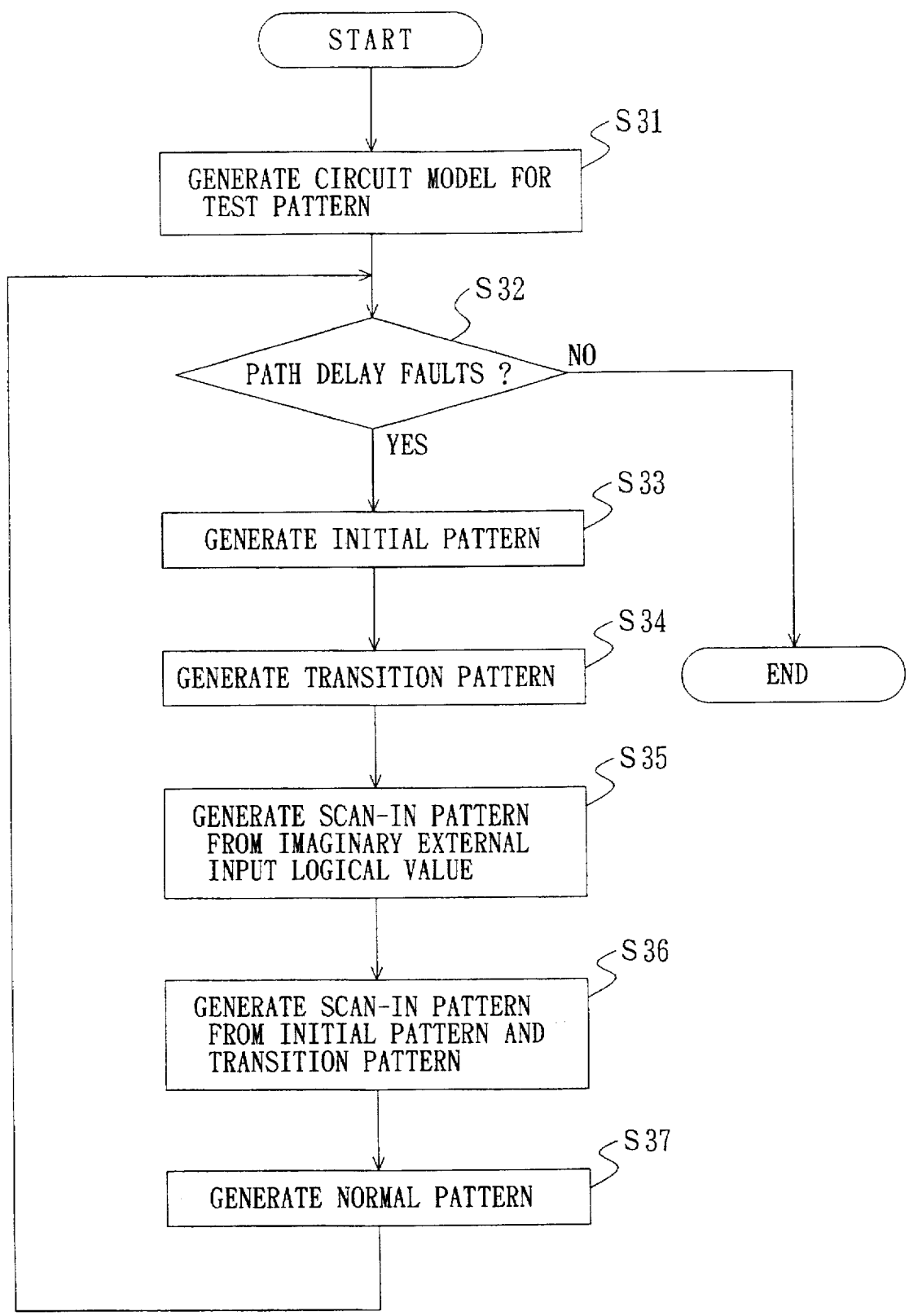
FIG. 8 is a flow chart illustrating the process of a test pattern generation method for detecting of path delay faults according to a third embodiment of the present invention.

FIG. 8 is a flow chart illustrating the process of the test pattern generation method according to the third embodiment.

At a step S31, a circuit model for test pattern generation is to be generated based on a given integrated circuit. More specifically, a D latch disposed by the design-for-testability method according to the first embodiment, is converted into a two-input selector having one data input terminal connected to the scan flip-flop which had been connected to the data input terminal of the D latch, and the other data input terminal connected to an imaginary external input pin. It is now supposed that a selection signal input terminal of the selector is connected to an imaginary selection signal external input pin.

At a step S32, it is judged whether or not the given integrated circuit contains path delay faults which have not yet been processed. In the affirmative, one path delay fault to be processed is selected and the sequence proceeds to a step S33. In the negative, the process is finished.

At the step S33, an initial pattern is to be generated for the circuit model generated at the step S31. More specifically, there is set, to the starting point of a signal path supposed to contain the path delay fault, a logical value of "0" when the selected path delay fault is a rising delay fault, and a logical value of "1" when the selected path delay fault is a falling delay fault. Further, a logical value for sensitizing the signal path is set to an external input pin or the data output terminal of a scan flip-flop which is other than the signal path starting point.

At a step S34, a transition pattern is to be generated for the circuit model generated at the step S31. More specifically, there is set, to the signal path starting point, a logical value of "1" when the selected path delay fault is a rising delay fault and a logical value of "0" when the selected path delay fault is a falling delay fault. When the signal path starting point is the data output terminal of a scan flip-flop, the logical value of an external input pin or a scan flip-flop is set such that an input data of the first-mentioned scan flip-flop in a normal mode is identical with the set logical value. Further, the value of an external input pin or the data output terminal of a scan flip-flop is set such that an input data, in a normal mode, of the scan flip-flop having the data output terminal to which a logical value has been set in the initial pattern generated at the step S33 and which does not serve as the path starting point, is identical with the logical value set in the initial pattern.

At a step S35, there is generated, for the given integrated circuit, a scan-in pattern in which the logical value of the other data input terminal, out of the two data input terminals of the selector converted at the step S31, connected to the imaginary external input pin, is set to the scan flip-flop to which the data output terminal of the selector is connected. In the scan-in pattern, the logical value of the external input pin connected to the enable input terminal of the D latch inserted by the design-for-testability method, is set such that the D latch is in a data-through mode.

At a step S36, there is generated a scan-in pattern in which the logical values set in the initial pattern at the step S33 and in the transition pattern at the step S34, are set to the data output terminals of respective scan flip-flops. Also, in this scan-in pattern, the logical value of the external input pin connected to the enable input terminal of the D latch inserted by the design-for-testability method, is set such that the D latch is in a data holding mode.

At a step S37, there is generated a test pattern (normal pattern) in which the logical value of an external input pin for switching the scan mode and the normal mode is set such that the integrated circuit is in the normal mode, and in which one clock pulse is generated.

The test pattern generation method according to the third embodiment will be discussed in more detail with the circuit in FIG. 5 taken as an example. As already discussed in the first embodiment, the D latches 30a, 30b are inserted in the circuit in FIG. 5 by the design-for-testability method.

Figure 9:
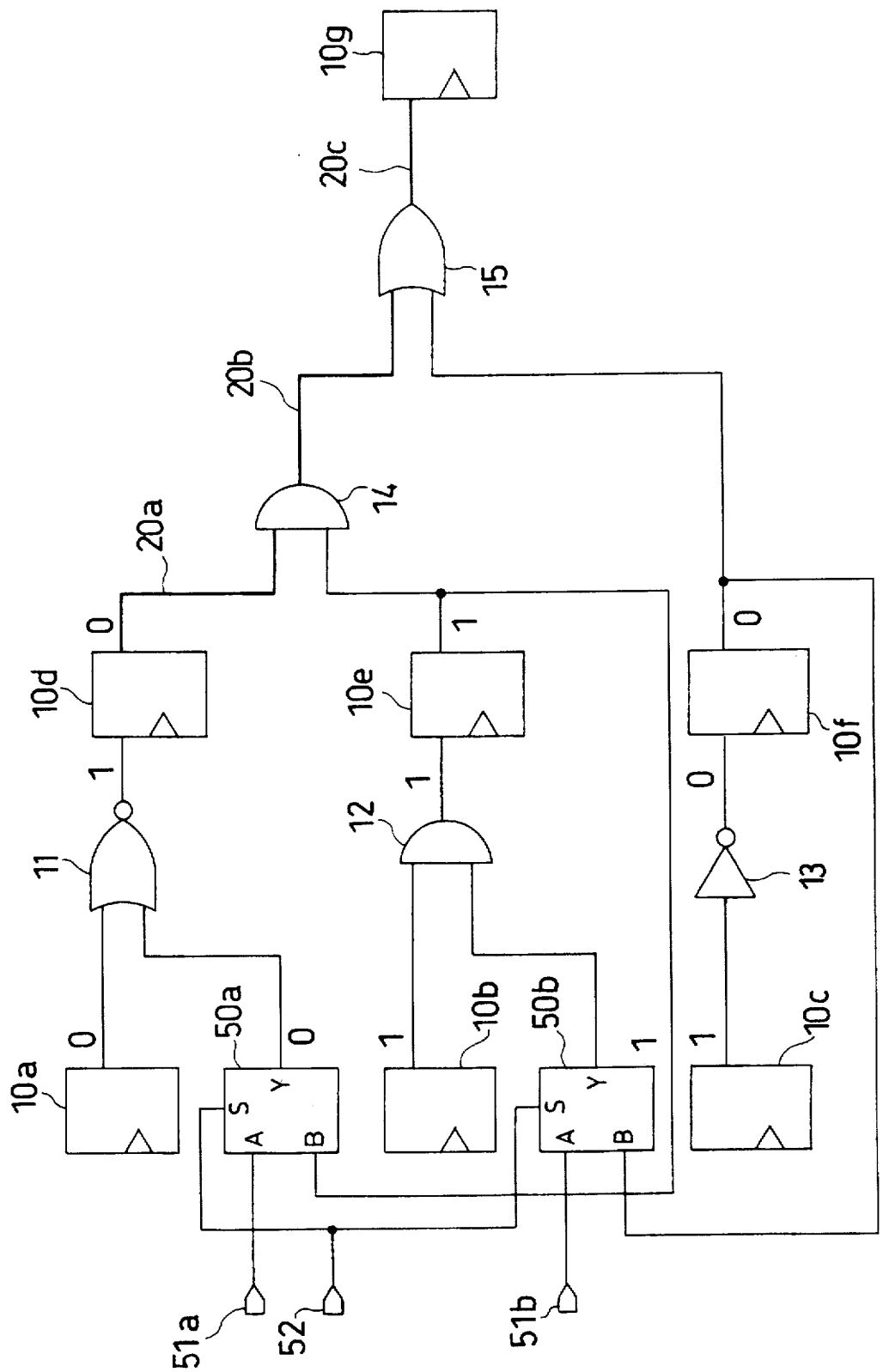
FIG. 9 is a circuit diagram illustrating a circuit model generated by the test pattern generation method according to the third embodiment of the present invention.

At the step S31, a circuit model for test pattern generation is generated based on the circuit in FIG. 5. FIG. 9 is a circuit diagram illustrating the circuit model generated based on the circuit shown in FIG. 5. In FIG. 9, the D latch 30a is converted into a selector 50a, and the D latch 30b is converted into a selector 50b. The selector 50a has one data input terminal connected to an imaginary external input pin 51a and the other data input terminal connected to the data output terminal of the scan flip-flop 10e. The selector 50b has one data input terminal connected to an imaginary external input pin 51b and the other data input terminal connected to the scan flip-flop 10f. Further, selection signal input terminals of the selectors 50a, 50b are commonly connected to an imaginary selection signal external input pin 52.

At the step S32, there is selected, out of the path delay faults which have not yet been processed, a rising delay fault in the signal paths 20a, 20b, 20c.

At the step S33, an initial pattern is to be generated for the circuit model in FIG. 9. More specifically, a logical value of "0" is set to the data output terminal of the scan flip-flop 10d serving as the starting point of a signal path supposed to contain the path delay fault. For sensitizing the signal paths 20b, 20c, a logical value "1" is set to the data output terminal of the scan flip-flop 10e and a logical value of "0" is set to the scan flip-flop 10f.

At the step S34, a transition pattern is to be generated for the circuit model shown in FIG. 9. More specifically, a logical value of "1" is set to the data output terminal of the scan flip-flop 10d serving as the starting point of the signal paths. To give a logical value of "1" as an input data of the scan flip-flop 10d in the normal mode, a logical value of "0" is set to each of the data output terminals of the scan flip-flop 10a and the selector 50a. It is supposed that the selector 50a is instructed by a selection signal supplied from the imaginary selection signal external input pin 52 such that the selector 50a always selects a data supplied from the imaginary external input pin 51a. Accordingly, a logical value of "0" is also set to the imaginary external input pin 51a.

To give, as an input data of the scan flip-flop 10e in the normal mode, the logical value of "1" set to the data output terminal thereof in the initial pattern, a logical value of "1" is set to each of the data output terminals of the scan flip-flop 10b and the selector 50b. It is supposed that the selector 50b is instructed by a selection signal supplied from the imaginary selection signal external input pin 52 such that the selector 50b always selects a data supplied from the imaginary external input pin 51b. Accordingly, a logical value of "1" is also set to the imaginary external input pin 51b.

To give, as an input data of the scan flip-flop 10f in the normal mode, the logical value of "0" set to the data output terminal thereof in the initial pattern, a logical value of "1" is set to the data output terminal of the scan flip-flop 10c.

At the step S35, there is generated, for the actual circuit shown in FIG. 5, a scan-in pattern in which the logical value of "0" set to the imaginary external input pin 51a is set to the data output terminal of the scan flip-flop 10e and in which the logical value of "1" set to the imaginary external input pin 51b is set to the data output terminal of the scan flip-flop 10f. In this scan-in pattern, the logical value of the external input pin 31 is set such that each of the D latches 30a, 30b is in the data-through mode.

At the step S36, there is generated, for the actual circuit shown in FIG. 5, a scan-in pattern in which the logical values respectively set to the scan flip-flops 10a to 10f in the initial and transition patterns, are given to the scan flip-flops 10a to 10f, respectively. In this scan-in pattern, the logical value of the external input pin 31 is set such that each of the D latches 30a, 30b is in the data holding mode.

At the step S37, a normal pattern for one clock is generated such that each scan flip-flop conducts a normal shift operation. At this time, the logical value of the mode changeover external input pin is set such that each scan flip-flop is in the normal mode. By repeating the steps S33 to S37, a test pattern is generated for all the path delay faults.

As discussed in the foregoing, according to the test pattern generation method of the third embodiment, a test pattern can readily be generated for an integrated circuit in which design for testability has been made by disposing a D latch.

Also, a test pattern can readily be generated for an integrated circuit in which design for testability has been made by disposing a tri-state element.

What is claimed is:

1. A design-for-testability method for path delay faults, by which a given integrated circuit is changed in design to cause path delay faults therein to be easily testable, comprising the step of disposing, when said given integrated circuit contains a scan flip-flop for which logical values have been set in initial and transition patterns generated for test and which presents a contradiction in logical value, a value holding element for once holding an input data according to an external instruction at such a position as to hold an output data of said scan flip-flop in said integrated circuit.

2. A design-for-testability method for path delay faults, by which a full-scan designed integrated circuit is changed in design to easily test whether or not there is present a path delay fault in which, in a signal path composed of only combinational circuits from the starting point to the terminal point, the transmission of a signal supplied from said starting point to said terminal point takes time not less than a clock period, said starting point being an external input pin or the data output terminal of a scan flip-flop, and said terminal point being an external output pin or the data input terminal of a scan flip-flop in a normal mode, a path delay fault in which the signal supplied from the signal path starting point is a rising signal, being referred to as a rising delay fault, and a path delay fault in which the signal supplied from the signal path starting point is a falling signal, being referred to as a falling delay fault, said design-for-testability method comprising:

a first process in which an initial pattern is generated (i) by setting, to the starting point of a signal path supposed to contain a path delay fault to be tested, a logical value of "0" when said path delay fault is a rising delay fault, and a logical value of "1" when said path delay fault is a falling delay fault, and (ii) by setting a logical value for sensitizing said signal path, to an external input pin or the data output terminal of a scan flip-flop which is other than said signal path starting point;

a second process in which there are stored said logical values of said scan flip-flops having the output terminals to which said logical values have been set in said initial pattern generated at said first process;

a third process in which a transition pattern is generated (i) by setting, to said starting point of said signal path to be tested, a logical value of "1" when said path delay fault is a rising delay fault and a logical value of "0" when said path delay fault is a falling delay fault, (ii) by setting, when said signal path starting point is the data output terminal of a scan flip-flop, a logical value to an external input pin or the data output terminal of a scan flip-flop such that an input data of said first-mentioned scan flip-flop in a normal mode is identical with the set logical value, and (iii) by setting a logical value to an external input pin or the data output terminal of a scan flip-flop such that an input data, in a normal mode, of said scan flip-flop having the data output terminal to which said logical value has been set in said initial pattern and which does not serve as said signal path starting point, is identical with said logical value stored by said second process; and a fourth process (i) in which it is judged whether or not the integrated circuit contains a scan flip-flop having the data output terminal to which logical values have been set in said initial and transition patterns and which presents a contradiction in logical value, and (ii) in which when said integrated circuit contains such a scan flip-flop, a value holding element for once holding an input data according to an external instruction, is disposed at such a position as to hold an output data of said scan flip-flop in said integrated circuit.

3. A design-for-testability method for path delay faults according to claim 2, wherein said fourth process comprises a process in which a D latch is disposed, as said value holding element, in said integrated circuit and in which the enable input terminal of said D latch thus disposed is connected to an external input pin of said integrated circuit.

4. A design-for-testability method for path delay faults according to claim 2, wherein said fourth process comprises a process in which a tri-state element is disposed, as said value holding element, in said integrated circuit and in which the enable input terminal of said tri-state element thus disposed is connected to an external input pin of said integrated circuit.

5. A design-for-testability method for path delay faults according to claim 2, wherein said fourth process comprises a process in which a scan flip-flop or D flip-flop is disposed, as said value holding element, in said integrated circuit and in which said scan flip-flop or D flip-flop thus disposed is connected to a scan chain already formed in said integrated circuit.

6. A design-for-testability method for path delay faults according to claim 5, wherein said fourth process comprises a process of disposing, in said integrated circuit, a selector for selectively supplying one of (i) an output data of said scan flip-flop having the data output terminal to which logical values have been set in said initial and transition patterns and which presents a contradiction in logical value, and (ii) an output data of said scan flip-flop or D flip-flop disposed, as said value holding element, at said position capable of holding said output data of said first-mentioned scan flip-flop.

7. A path-delay-fault test pattern generation method of generating a test pattern for detecting the presence or absence of a path delay fault in a signal path in an integrated circuit in which design for testability has been made using the design-for-testability method for path delay faults according to claim 3, a path delay fault in which a signal supplied from the starting point of a signal path is a rising signal, being referred to as a rising delay fault, and a path delay fault in which a signal supplied from the starting point of a signal path is a falling signal, being referred to as a falling delay fault, said test pattern generation method comprising:

a first process in which a circuit model for test pattern generation is generated (i) by converting a D latch disposed by design for testability, into a selector having one data input terminal connected to the output terminal of the scan flip-flop which had been connected to the data input terminal of said D latch and the other data input terminal connected to an imaginary external input pin, and (ii) by connecting a selection signal input terminal of said selector to an imaginary selection signal external input pin;

a second process in which an initial pattern is generated for said circuit model generated by said first process (i) by setting, to the starting point of a signal path supposed to contain a path delay fault for which a test pattern is to be generated, a logical value of "0" when said path delay fault is a rising delay fault, and a logical value of "1" when said path delay fault is a falling delay fault, and (ii) by setting a logical value for sensitizing said signal path, to an external input pin or the output terminal of a scan flip-flop which is other than said signal path starting point;

a third process in which a transition pattern is generated for said circuit model generated by said first process (i) by setting, to said signal path starting point, a logical value of "1" when said path delay fault is a rising delay fault and a logical value of "0" when said path delay fault is a falling delay fault, (ii) by setting, when said signal path starting point is the data output terminal of a scan flip-flop, a logical value to an external input pin or the data output terminal of a scan flip-flop such that an input data of said first-mentioned scan flip-flop in a normal mode is identical with the set logical value, and (iii) by setting a logical value to an external input pin or the data output terminal of a scan flip-flop such that an input data, in the normal mode, of said scan flip-flop having the data output terminal to which a logical value has been set in said initial pattern and which does not serve as said signal path starting point, is identical with said logical value set in said initial pattern;

a fourth process in which there is generated, for said integrated circuit, a scan-in pattern (i) in which the logical value at said imaginary external input pin connected to said other data input terminal of said selector in said circuit model, is set to said output terminal of said scan flip-flop connected to said one data input terminal of said selector, and (ii) in which the logical value at the external input pin connected to the enable input terminal of said D latch disposed by said design for testability, is set such that said D latch is in a data-through mode; and a fifth process in which there is generated, for said integrated circuit, a scan-in pattern (i) in which the logical values set in said initial and transition patterns are set to said data output terminals of said scan flip-flops, and (ii) in which the logical value at said external input pin connected to said enable input terminal of said D latch is set such that said D latch is in a data holding mode.

8. A path-delay-fault test pattern generation method of generating a test pattern for detecting the presence or absence of a path delay fault in a signal path in an integrated circuit in which design for testability has been made using the design-for-testability method for path delay faults according to claim 4, a path delay fault in which a signal supplied from the starting point of a signal path is a rising signal, being referred to as a rising delay fault, and a path delay fault in which a signal supplied from the starting point of a signal path is a falling signal, being referred to as a falling delay fault, said test pattern generation method comprising:

a first process in which a circuit model for test pattern generation is generated (i) by converting a tri-state element disposed by design for testability, into a selector having one data input terminal connected to the output terminal of the scan flip-flop which had been connected to the data input terminal of said tri-state element and the other data input terminal connected to an imaginary external input pin, and (ii) by connecting a selection signal input terminal of said selector to an imaginary selection signal external input pin;

a second process in which an initial pattern is generated for said circuit model generated by said first process (i) by setting, to the starting point of a signal path supposed to contain a path delay fault for which a test pattern is to be generated, a logical value of "0" when said path delay fault is a rising delay fault, and a logical value of "1" when said path delay fault is a falling delay fault, and (ii) by setting a logical value for sensitizing said signal path, to an external input pin or the output terminal of a scan flip-flop which is other than said signal path starting point;

a third process in which a transition pattern is generated for said circuit model generated by said first process (i) by setting, to said signal path starting point, a logical value of "1" when said path delay fault is a rising delay fault and a logical value of "0" when said path delay fault is a falling delay fault, (ii) by setting, when said signal path starting point is the data output terminal of a scan flip-flop, a logical value to an external input pin or the data output terminal of a scan flip-flop such that an input data of said first-mentioned scan flip-flop in a normal mode is identical with the set logical value, and (iii) by setting a logical value to an external input pin or the data output terminal of a scan flip-flop such that an input data, in the normal mode, of said scan flip-flop having the data output terminal to which a logical value has been set in said initial pattern and which does not serve as said signal path starting point, is identical with said logical value set in said initial pattern;

a fourth process in which there is generated, for said integrated circuit, a scan-in pattern (i) in which the logical value at said imaginary external input pin connected to said other data input terminal of said selector in said circuit model, is set to said data output terminal of said scan flip-flop connected to said one data input terminal of said selector, and (ii) in which the logical value at the external input pin connected to the enable input terminal of said tri-state element disposed by said design for testability, is set such that said tri-state element is in a data-through mode; and a fifth process in which there is generated, for said integrated circuit, a scan-in pattern (i) in which the logical values set in said initial and transition patterns are set to said data output terminals of said scan flip-flops, and (ii) in which the logical value at said external input pin connected to said enable input terminal of said tri-state element is set such that said tri-state element is in a data holding mode.

9. An integrated circuit so changed in design as to easily test whether or not there is a path delay fault therein, comprising:

a scan flip-flop for which logical values have been set in initial and transition patterns generated for testing whether or not there is a path delay fault therein and which presents a contradiction in logical value; and a value holding element for once holding an input data according to an external instruction, said value holding element being disposed at such a position as to hold an output data of said scan flip-flop.

10. An integrated circuit according to claim 9, wherein said disposed value holding element is a D latch of which enable input terminal is connected to an external input pin.

11. An integrated circuit according to claim 9, wherein said disposed value holding element is a tri-state element of which enable input terminal is connected to an external input pin.

12. An integrated circuit according to claim 9, wherein said disposed value holding element is a scan flip-flop or D flip-flop connected to a scan chain which has already been formed before change in design.

13. An integrated circuit according to claim 12, further comprising a selector for selectively supplying one of an output data of said scan flip-flop and an output data of said scan flip-flop or D flip-flop disposed as said value holding element.

* * * * *

UNITED STATES PATENT AND TRADEMARK OFFICE
CERTIFICATE OF CORRECTION

PATENT NO. : 5,748,646
DATED : May 5, 1998
INVENTOR(S) : Toshinori HOSOKAWA

It is certified that error appears in the above-indentified patent and that said Letters Patent is hereby corrected as shown below:

Col. 10, line 2: After "for" insert --a--.

Signed and Sealed this

Twenty-second Day of September, 1998

Attest:

BRUCE LEHMAN

*Attesting Officer*  *Commissioner of Patents and Trademarks*